United States Patent

Egawa

[11] Patent Number: 6,102,564
[45] Date of Patent: Aug. 15, 2000

[54] RADIATION THERMOMETER

[75] Inventor: Shunji Egawa, Tokorozawa, Japan

[73] Assignee: Citizen Watch Co., Ltd., Tokyo, Japan

[21] Appl. No.: 09/101,463

[22] PCT Filed: Oct. 31, 1997

[86] PCT No.: PCT/JP97/03977

§ 371 Date: Jul. 10, 1998

§ 102(e) Date: Jul. 10, 1998

[87] PCT Pub. No.: WO98/20790

PCT Pub. Date: May 22, 1998

[30] Foreign Application Priority Data

Nov. 14, 1996 [JP] Japan .................................. 8-302282

[51] Int. Cl.[7] .................................. G01J 5/08; G01J 5/10
[52] U.S. Cl. ........................ 374/129; 374/131; 374/132; 374/133; 600/474
[58] Field of Search .................. 374/129, 131, 374/132, 133; 600/474, 549

[56] References Cited

U.S. PATENT DOCUMENTS

| | | | |
|---|---|---|---|
| 3,619,614 | 11/1971 | Yamaka | 374/132 |
| 4,005,605 | 2/1977 | Michael | 374/133 |
| 4,408,827 | 10/1983 | Guthrie et al. | 374/131 |
| 4,932,789 | 6/1990 | Egawa | 374/131 |
| 5,078,507 | 1/1992 | Koller | 374/131 |
| 5,293,877 | 3/1994 | O'Hara et al. | 374/133 |
| 5,368,038 | 11/1994 | Fraden | 374/131 |

FOREIGN PATENT DOCUMENTS 7-184866  7/1995  Japan .
8-191800  7/1996  Japan .

*Primary Examiner*—Diego Gutierrez
*Assistant Examiner*—Lydia De Jesús
*Attorney, Agent, or Firm*—Townsend and Townsend and Crew LLP

[57] ABSTRACT

The radiation clinical thermometer of the present invention is provided with a light guide tube 15 to guide the infrared radiation from the temperature-measured object, a first infrared sensor 10 for detecting the infrared radiation from the light guide tube 15, a temperature sensitive sensor 12 which generates a reference temperature signal, a reference cavity 17 which has approximately the same temperature condition as the light guide tube 15 and is sealed so as to shut out infrared radiation from outside, a second infrared sensor 11 for detecting the infrared radiation from the reference cavity 17, a temperature computing means 13 for calculating temperature in accordance with the signals from the first infrared sensor 10 and the second infrared sensor 11, a temperature sensitive sensor 12, and a display unit 14 for displaying temperature in accordance with the signal from the temperature computing means 13; and at least either the light guide tube 15 or the reference cavity 17 is tapered off toward the emission inlet of the light guide tube 15 from the first or second infrared sensor 10 or 11 side.

12 Claims, 9 Drawing Sheets

RADIATION THERMOMETER

TECHNICAL FIELD OF THE INVENTION

The present invention relates to a radiation clinical thermometer which detects thermal radiation energy to measure temperature without contact.

RELATED ARTS

To measure body temperature in a short period of time, a radiation clinical thermometer which allows one to choose the eardrum for measuring the temperature thereof without contacting the same has been suggested.

For example, the present applicant proposed the radiation clinical thermometer shown in FIGS. 10 and 11 in Japanese Patent Application No-Hei-7-294117. FIG. 10 is a front elevation view showing the radiation clinical thermometer proposed in Japanese Patent Application No. Hei-7-294117.

The radiation clinical thermometer 1 is a clinical thermometer designed to measure the temperature of the eardrum comprising a main body 4 and a probe 2. The main body 4 is provided with a liquid crystal display element 6 for displaying the body temperature and a measurement switch 5 of a push button structure.

The radiation clinical thermometer 1 operates as follows. First, the measurement switch 5 is pressed to turn on the power for starting temperature measurement, Subsequently, the probe 2 is inserted into the meatus auditorium externus of the subject to face the eardrum to measure the temperature thereof. The probe 2 is oriented to the eardrum properly and then the probe 2 is taken out of the meatus auditorium externus. The liquid crystal display component 6 shows the maximum temperature measured here, so that the temperature of the eardrum, that is, the body temperature, is displayed to allow one to read the display as the body temperature of the subject.

FIG. 11 is a partially cut-out cross-sectional view showing the probe 2 of the radiation clinical thermometer shown in FIG. 10.

The probe 2 is provided, on the top-end thereof, with a filter 7 which has transmission wavelength characteristics. The dustproof filter 7 is made from optical crystal such as silicon (Si) or barium fluoride ($BaF_2$) or a polymer such as polyethylene, and selectively transmits infrared-wavelength radiation.

A light guide tube 8 is a tube which is provided to efficiently converge the thermal radiation from the eardrum the temperature of which is to be measured, made of metal pipes such as copper, brass, or stainless steel, and the inner surface of which is a mirror-finished surface coated with gold (Au) to increase the reflectivity. The application of the coating, however, will not allow the inner surface of the light guide tube 8 to become a perfect reflector having a reflective index of 1.00 and thus cause the inner surface of the light guide tube 8 to remain more or less radiative.

A light guide tube 9 is made from the same material as the light guide tube 8 with the inner surface treated in the same way as the light guide tube 8 and one end (on the side of the filter 7) sealed so that infrared radiation cannot come in from the temperature-measured object. In addition, the light guide tube 9 is provided close to the light guide tube 8 so as to keep approximately the same temperature as the light guide tube 8. The condition required for the light guide tube 9 is to reach approximately the same temperature as the light guide tube 8 but not always necessarily to be the same in material or inner surface condition.

A first infrared sensor 10 detects the infrared radiation emitted by the temperature-measured object and converged by the light guide tube 8, and also detects the thermal radiation from the light guide tube 8 itself. A second infrared sensor 11 detects the thermal radiation from the light guide tube 9 itself because the top-end of the light guide tube 9 is sealed. In addition, the second infrared sensor 11 is provided close to the first infrared sensor 10 so as to have approximately the same temperature as the first infrared sensor 10. A temperature sensitive sensor 12 is a sensor which allows for measuring the temperature of the first infrared sensor 10 and the second infrared sensor 11.

The operation principle with the first and second infrared sensors 10 and 11 is briefly explained here. If the light guide tube 8 and the first infrared sensor 10 are at the same temperature, the first infrared sensor 10 is allowed to apparently detect the infrared radiation only from the temperature-measured object. This is because the light guide tube 8 also gives off thermal radiation but has the same temperature as the infrared sensor 10, so that the thermal radiation from the light guide tube 8 is negligible when the difference in radiance and incidence at the infrared sensor 10 is taken into account. A difference in temperature between the light guide tube 8 and the first infrared sensor 10, however, develops a difference in thermal radiation between the light guide tube 8 and the first infrared sensor 10 to cause the first infrared sensor 10 to detect the thermal radiation from the temperature-measured object and the light guide tube 8 so that the thermal radiation from the light guide tube 8 is not negligible.

Therefore the known radiation clinical thermometer 1 is provided with the second infrared sensor 11 to allow the second infrared sensor 11 to detect the infrared radiation from the light guide 9, which is held under the same temperature condition as the light guide tube 8, to reduce at an adequate proportion the output of the second infrared sensor 11 from the output of the first infrared sensor 10 which is affected by the temperature of the light guide tube 8 to detect the infrared radiation from the temperature-measured object, independent of the temperature effects of the light guide tube 8.

Another example of the prior arts is not a clinical thermometer but a radiation thermometer which is disclosed in Japanese Laid-open Patent Publication No. Sho-61-66131.

This radiation thermometer is provided with a signal fiber which guides the infrared radiation from the temperature-measured object and corresponds to the light guide tube 8 of the radiation clinical thermometer proposed in Japanese Patent Application No. Hei-7-294117, and with a disturbance fiber corresponding to the light guide tube 9 to eliminate the effects of disturbance for measuring temperature.

There exists the problem, however, that providing two light guide tubes or fibers as conventionally done causes the diameter of the top-end for facing to the temperature-measured object, that is, the probe, to become larger to accommodate two or more light guide tubes or fibers.

Especially for a radiation clinical thermometer which is inserted into the meatus auditorius externus to detect the infrared radiation from the eardrum, there exists a problem that a radiation clinical thermometer with a probe of a large diameter has difficulty in inserting the radiation clinical thermometer into the meatus auditorium externus to face to the eardrum of a child whose ear hole is small.

To overcome this problem, it may be considered to make the two light guide tubes etc. thinner, however, this causes the emission outlet of the light guide tubes to become smaller and also the original view of the infrared sensor to become smaller due to the emission outlet. Additionally this causes the incident energy to decrease to lead to a decrease in sensitivity. Generally, making the view narrower tends to lead to decreasing the incident energy. And also a thin light guide tube etc. causes the number of reflections of infrared radiation inside the light guide tube to increase. Taking into account that energy is lost at every reflection, sensitivity is disadvantageously affected in this point.

DISCLOSURE OF THE INVENTION

The present invention is for purposes of the foregoing to provide a radiation clinical thermometer having a top-end, that is, a probe, for facing the temperature-measured object made thinner without reducing sensitivity.

To achieve the foregoing purposes, the present invention is provided with a light guide means having an emission inlet and an emission outlet to guide the infrared radiation from the temperature-measured object, a first infrared sensor for detecting the infrared radiation from the light guide means, a temperature sensitive sensor which generates a reference temperature signal, a reference cavity which has approximately the same temperature condition as said light guide means and is sealed so as to shut out infrared radiation from outside, a second infrared sensor for detecting the infrared radiation from the reference cavity, a temperature computing means for calculating temperature in accordance with the signals from said first infrared sensor and said second infrared sensor, and said temperature sensitive sensor, and a display unit for displaying temperature in accordance with the signal from the temperature computing means; and the probe is provided on the inside thereof with said light guide means and said reference cavity, at least either said light guide means or said reference cavity being tapered toward the emission inlet from said first or second infrared sensor.

In one form of the invention the light guide means comprises a pipe and said reference cavity comprises a supporting member which supports said pipe.

Furthermore the invention contemplates that the light guide means comprises a pipe and the reference cavity comprises the outer wall of said pipe and the supporting member which supports said pipe.

In one form of the invention the supporting member comprises a member of high thermal conductivity, such as aluminum.

Another aspect of the invention provides that the first infrared sensor and the second infrared sensor are arranged in parallel to each other across the center of said probe, and the emission inlet of said pipe is positioned approximately at the center of said probe and the emission outlet is positioned toward said first infrared sensor, whereby the pipe is positioned diagonally against the center line of said probe.

In one embodiment of the invention the first infrared sensor is positioned on the center line of said probe and said pipe is positioned along said center line.

According to other aspects of the invention the light guide means and said reference cavity are formed into the same member in one piece; the temperature sensitive sensor is adhered to the bottom surface of the first infrared sensor or second infrared sensor by adhesive; a window member for transmitting infrared radiation is fitted to the probe so as to seal the emission inlet of said light guide means; the window member for transmitting infrared radiation can be fitted to said pipe so as to seal the emission inlet of said light guide means, or the window member for transmitting infrared radiation can be fitted to the supporting member for sealing the emission inlet of the light guide means.

According to the invention the reference cavity is tapered toward the emission inlet of the light guide means from the second infrared sensor without reducing sensitivity, so that a radiation clinical thermometer which has a thin top-end, that is, a probe, for facing temperature-measured objects can be provided. Furthermore, even in the case where the light guide means is tapered toward the emission inlet of the light guide means from the first infrared sensor side, a radiation clinical thermometer having a thin probe can be provided. Furthermore, compared with the conventional thermometer having two light guide tubes, a lesser number of light guide tubes allows for producing a cheaper radiation clinical thermometer.

Furthermore, tapering off the probe to the top-end allows in turn the emission outlet to broaden, whereby the area of the infrared sensor can be enlarged. An infrared sensor of a larger area allows for making the infrared sensor highly sensitive and thus providing a radiation clinical thermometer having a simple amplifier with less noise.

The invention has the effect that the reference cavity is formed only by the supporting member, whereby no space is available for allowing infrared radiation to come into the reference cavity from outside and thus infrared radiation from outside can be positively shut out.

Furthermore the invention has the effect that the reference cavity is formed by the supporting member and the outer wall of the light guide tube, whereby the reference cavity easily reflects the temperature of the light guide tube.

Another effect of the invention is that the light guide means and the reference cavity can be easily held to approximately the same temperature Additionally, in the case where a difference in temperature is developed between the light guide means and the infrared sensor, the effect that the light guide means and the infrared sensor reach an equilibrium state sooner is also given.

Furthermore the invention has the effect that aluminum has a good thermal conductivity and also allows for forming a supporting member of a complicated shape by aluminum die-casting.

Other effects of the invention are that a thinner probe can be made; that the center axis of the supporting member is the same as the center axis of the hole for inserting a pipe as the light guide tube, whereby the hole of the supporting member can be easily and accurately finished by cutting; that the use of a pipe as the light guide tube is not necessary so that costs can be saved; that the temperature of the sealed sensor can be measured with greater accuracy; that the filter can prevent water from coming into the probe; that the filter reaches the same temperature as the light guide tube, so that the body temperature can be measured more accurately; and/or that in the event the filter is fitted to the supporting member, the filter reaches approximately the same temperature as the supporting member (the light guide means by a light guide hole), so that the body temperature can be measured more accurately.

PREFERRED EMBODIMENTS OF THE INVENTION

The present invention is described below in accordance with the drawings.

Figure 10:
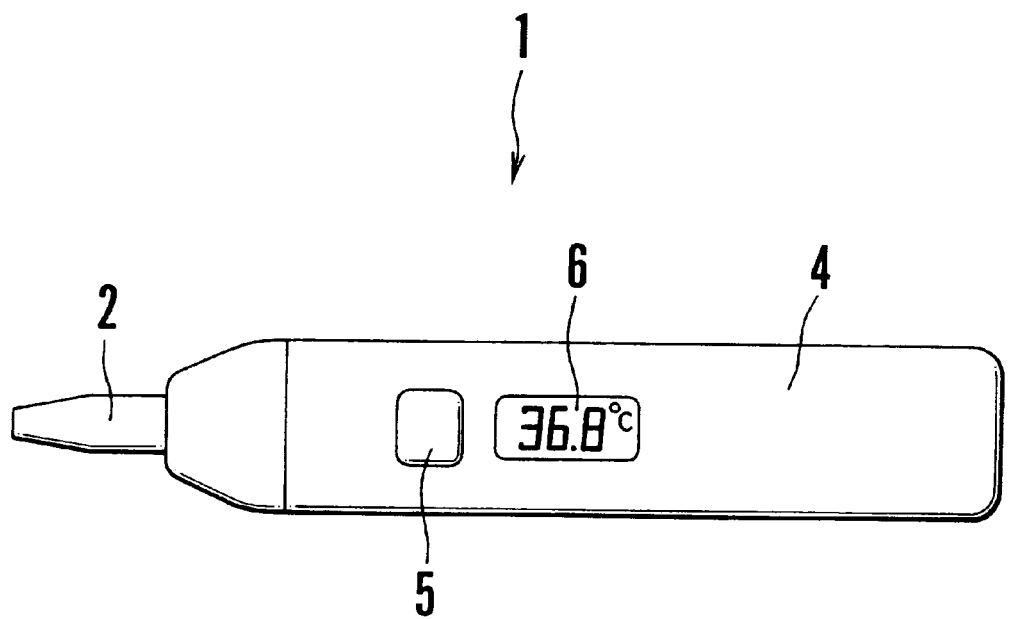
FIG. 10 is a front elevation view showing the radiation clinical thermometer suggested in Japanese Patent Application No. Hei-7-294117.

It is to be understood that the elevation front view of the radiation clinical thermometer in accordance with the present invention is almost the same as FIG. 10, so that explanation on the following embodiments of the present invention is carried out referring to FIG. 10.

Figure 1:
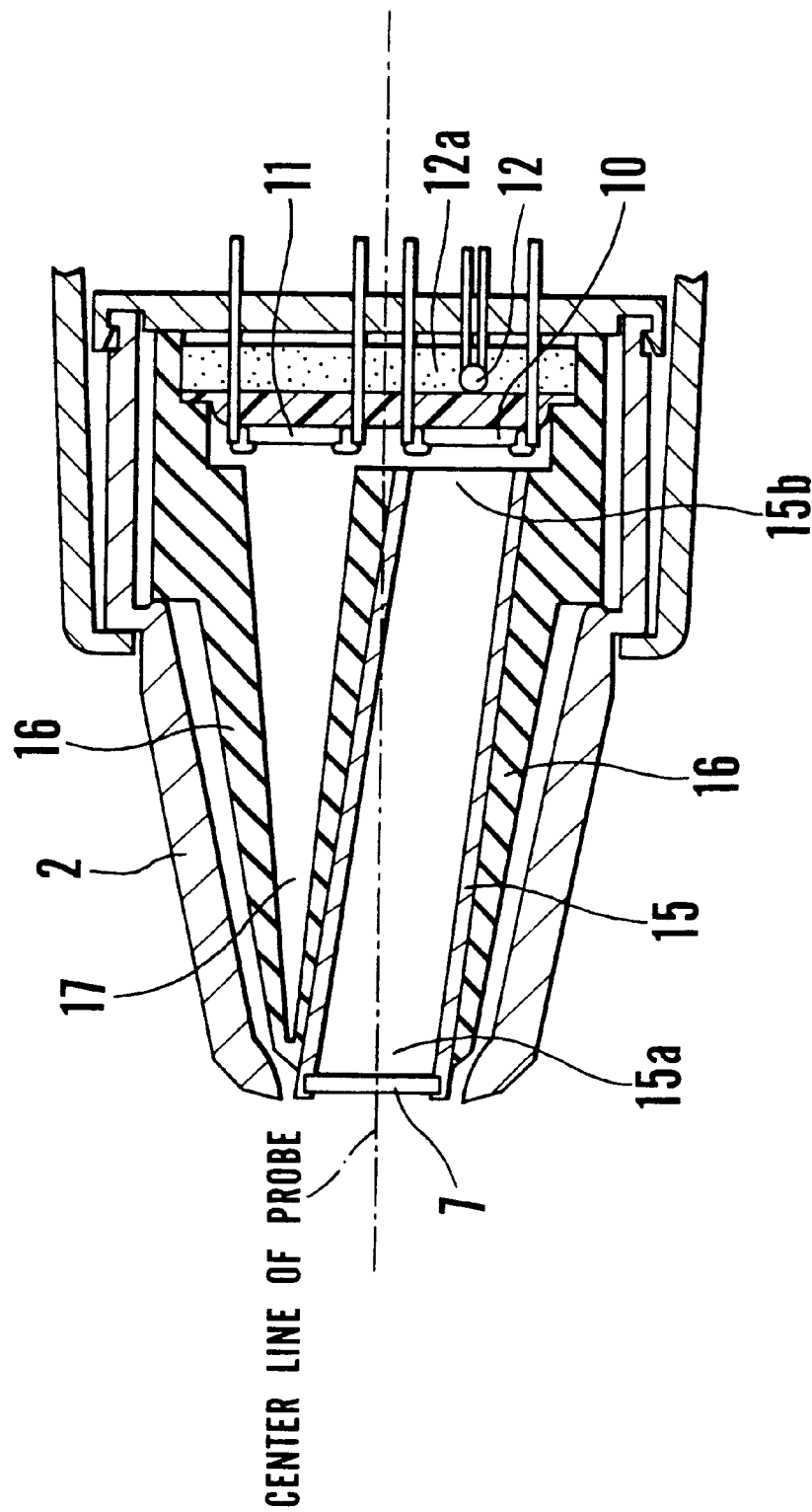
FIG. 1 is a partially cut-out cross-section view showing the probe of the first embodiment of the radiation clinical thermometer in accordance with the present invention.

FIG. 1 is a partially cut-out cross-section view showing the probe of the first embodiment of the radiation clinical thermometer in accordance with the present invention. The material of the probe 2 is, for example, ABS resin, and the probe 2 is provided inside with the light guide tube 15 and supporting member 16.

The light guide tube is a pipe which is provided to efficiently converge the thermal radiation from the eardrum the temperature of which is to be measured, made of metal such as copper, brass, or stainless steel, and the inner surface of which is a mirror-finished surface coated with gold (Au) to increase the reflectivity.

The light guide tube 15 is provided on the top-end thereof with the filter 7 having transmission wavelength characteristics The filter 7, a dustproof window member for transmitting infrared radiation, is formed by optical crystal such as silicon (Si) or barium fluoride ($BaF_2$), or a polymer such as polyethylene, and selectively transmits infrared-wavelength radiation. The light guide tube 15 is cut diagonally at the top-end thereof so that the filter 7 fitted to the top-end of the light guide tube 15 is positioned perpendicular to the center line of the probe.

Figure 11:
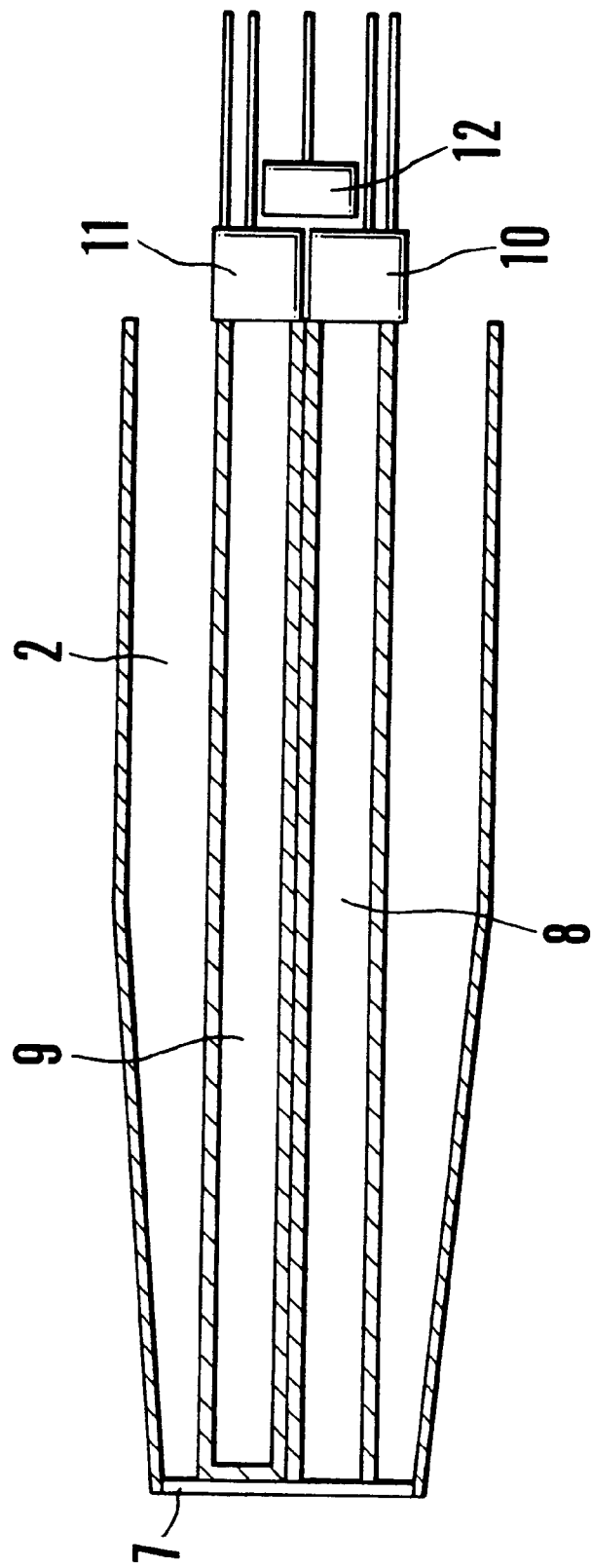
FIG. 11 is a partially cut-out cross-section view showing the probe 2 of the radiation clinical thermometer 1 shown in FIG. 10.

The supporting member 16, which is a member for supporting the light guide tube 15 inside the probe 2, has the shape shown in FIG. 1 to form the reference cavity 17 which serves as the light guide tube 9 in FIG. 11. The supporting member 16 is a member of high thermal conductivity, the material of which is, for example, aluminum. The reference cavity 17 is sealed at the one end thereof (on the side of filter 7) so as to prevent infrared radiation from coming in from the temperature-measured object. In addition, the reference cavity 17 is provided close to the light guide tube 15 to become approximately the same temperature as the light guide tube 15. The condition required for the reference cavity 17 is to reach approximately the same temperature as the light guide tube 15 but is not always necessarily the same in material or inner surface condition. Furthermore the reference cavity 17 is so constructed as to be tapered toward the emission inlet 15a from the second infrared sensor 11.

Infrared sensor 10 detects the infrared radiation emitted by the temperature-measured object and converged by the light guide tube 15, and also detects the thermal radiation from the light guide tube 15 itself. A second infrared sensor 11 detects the thermal radiation from the reference cavity 17 itself because the top-end of the reference cavity 17 is sealed. In addition, the second infrared sensor 11 is provided close to the first infrared sensor 10 so as to have approximately the same temperature as the first infrared sensor 10. A temperature sensitive sensor 12 is a sensor which allows for measuring the temperature of the first infrared sensor 10 and the second infrared sensor 11. Therefore the temperature sensitive sensor 12 is preferably fixed to the bottom surface of the first infrared sensor 10 or the second infrared sensor 11, for example, by adhesive 12a. An adhesive of high thermal conductivity may be preferably selected (for example, silicone of high thermal conductivity) for the adhesive 12a.

Furthermore the first infrared sensor 10 and the second infrared sensor 11 are arranged in parallel to each other across the center of the probe 2, and the emission inlet 15a of the light guide tube 15 is positioned approximately at the center of the probe 2 and the emission outlet 15b is positioned toward the first infrared sensor 10, whereby the light guide tube 15 is positioned diagonally against the center line of the probe 2.

Figure 2:
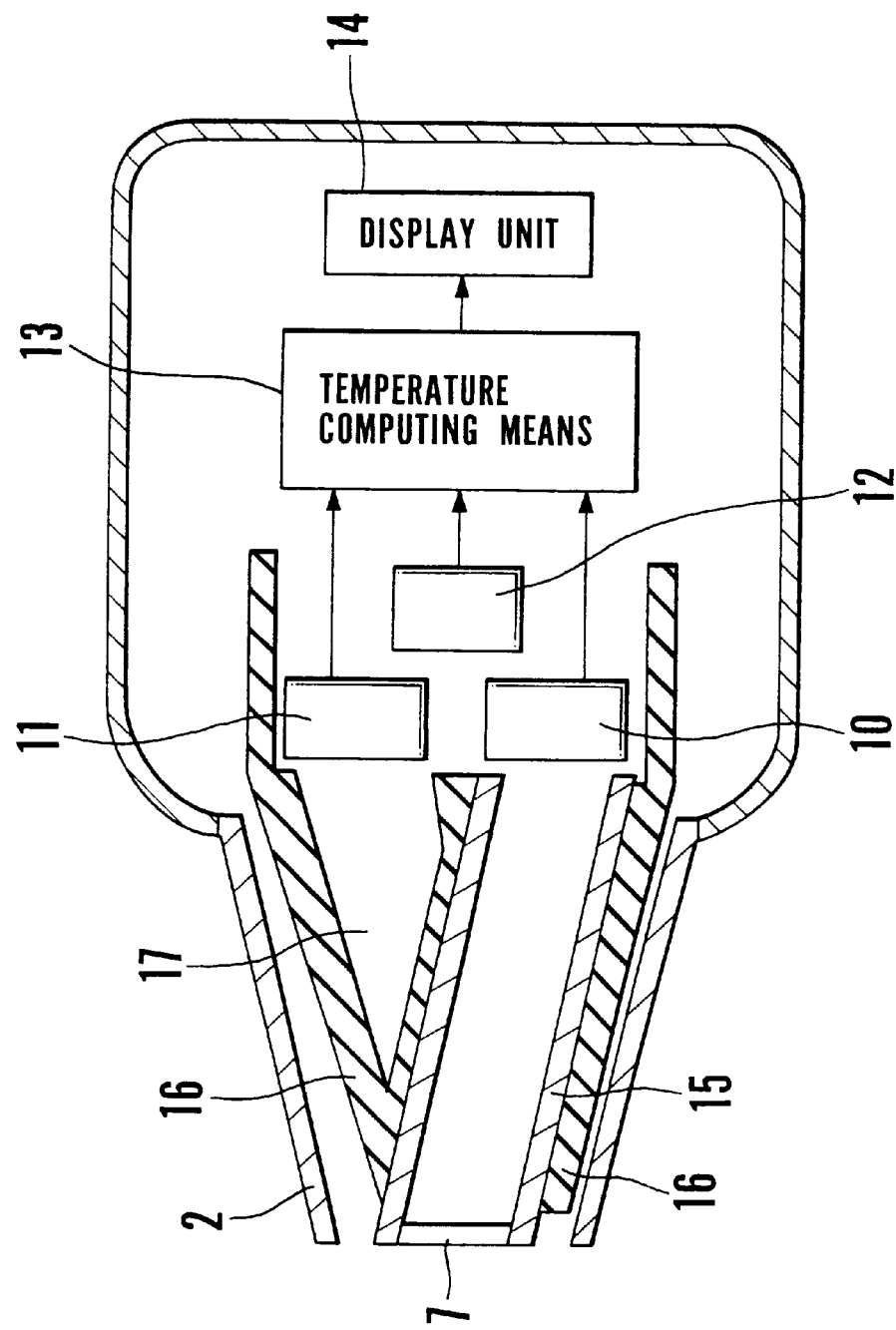
FIG. 2 is an explanatory block diagram showing the operation of the radiation clinical thermometer shown in FIG. 1.

FIG. 2 is an explanatory block diagram showing the operation of the radiation clinical thermometer shown in FIG. 1. It is to be understood that, in FIG. 2, those parts that are the same as in FIG. 1 are given by the same reference numbers.

The operation of the first and second infrared sensors 10 and 11 will now be briefly explained. If the light guide tube 15 and the first infrared sensor 10 are at the same temperature, the first infrared sensor 10 is allowed to apparently detect the infrared radiation only from the temperature-measured object. This is because the light guide tube 15 also gives off thermal radiation but has the same temperature as the infrared sensor 10, so that the thermal radiation from the light guide tube 15 is negligible when the difference in radiance and incidence at the infrared sensor 10 is taken into account. A difference in temperature between the light guide tube 15 and the first infrared sensor 10, however, develops a difference in thermal radiation between the light guide tube 15 and the first infrared sensor 10 to cause the first infrared sensor 10 to detect the thermal radiation from the temperature-measured object and the light guide tube 15 so that the thermal radiation from the light guide tube 15 is not negligible.

Therefore the radiation clinical thermometer of the present invention is provided with the second infrared sensor 11 to detect the infrared radiation from the reference cavity 17, which is held under the same temperature condition as the light guide tube 15, to reduce at an adequate proportion the output of the second infrared sensor 11 from the output of the first infrared sensor 10 which is affected by the temperature of the light guide tube 15 to detect the infrared radiation from the temperature-measured object, independent of the temperature effects of the light guide tube 15. The temperature computing means 13 calculates the temperature of the temperature-measured object in accordance with the outputs from the first infrared sensor 10, the second infrared sensor 11, and the temperature sensitive sensor 12, and displays the temperature on the display unit 14.

Figure 3:
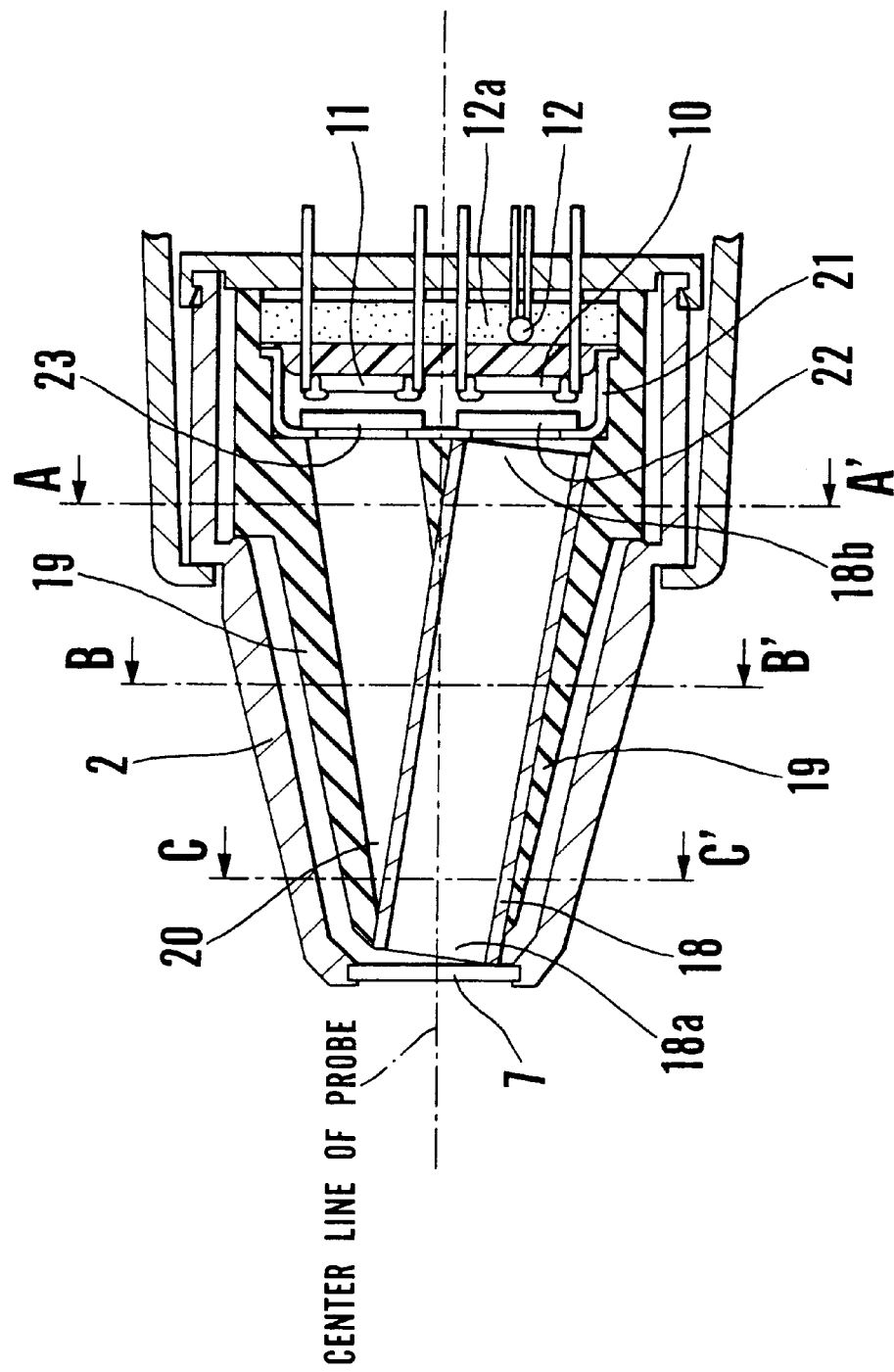
FIG. 3 is a partially cut-out cross-section view showing the probe of the second embodiment of the radiation clinical thermometer in accordance with the present invention.

FIG. 3 is a partially cut-out cross-section view showing the probe of the second embodiment of the radiation clinical thermometer in accordance with the present intention.

The material of the probe 2 is, for example, ABS resin, and the probe 2 is provided inside with the light guide tube is and supporting member 19.

The light guide tube 18 is a pipe to efficiently converge the thermal radiation from the eardrum the temperature of which is to be measured, is made of metal such as copper, brass, or stainless steel, and has an inner surface which is mirror-finished and coated with gold (Au) to increase the reflectivity.

The probe 2 is provided on the top-end thereof with the filter 7 hating transmission wavelength characteristics. The filter 7, a dustproof window member for transmitting infrared radiation, is formed by optical crystal such as silicon (Si) or barium fluoride (BaF$_2$), or a polymer such as polyethylene, and selectively transmits infrared-wavelength radiation. In this embodiment, the filter 7 is provided not on the top-end of the light guide tube 18 but on the top-end of the probe 2, so that the top-end of the light guide tube 18 is not required to be cut diagonally.

The supporting member 19, which is a member for supporting the light guide tube 19 inside the probe 2, has the shape shown in FIG. 3 to form the reference cavity 20 which serves as the light guide tube 9 in FIG. 11. The supporting member 19 is a member of high thermal conductivity, the material of which is, for example, aluminum. The reference cavity 20 of this embodiment comprises the supporting member 19 and the outer wall of the light guide tube 18, and is sealed at the one end thereof (on the side of filter 7) so as to prevent infrared radiation from coming in from the temperature-measured object Additionally, the outer wall of the light guide tube 18 constitutes a part of the reference cavity 20, so that the inner wall of the reference cavity 20 approximates the same temperature as the inner wall of the light guide tube 18. The condition required for the reference cavity 20 is to reach almost the same temperature as the light guide tube 18 but is not always necessarily the same in material or inner surface condition. Furthermore the reference cavity 20 is so constructed as to be tapered toward the filter 7 side from the second infrared sensor 11 side.

Infrared sensor 10 detects the infrared radiation emitted by the temperature-measured object and converged by the light guide tube 18, and also detects the thermal radiation from the light guide tube 18 itself. The second infrared sensor 11 detects the thermal radiation from the reference cavity 20 itself because the top-end of the reference cavity 20 is sealed. In addition, the second infrared sensor 11 is provided close to the first infrared sensor 10 so as to have approximately the same temperature as the first infrared sensor 10. The temperature sensitive sensor 12 is a sensor which allows for measuring the temperature of the first infrared sensor 10 and the second infrared sensor 11. Therefore the temperature sensitive sensor 12 is preferably fixed to the bottom surface of the first infrared sensor 10 or the second infrared sensor 11, for example, by adhesive 12a. An adhesive of high thermal conductivity may be preferably selected (for example, silicone of high thermal conductivity) as the adhesive 12a.

Furthermore the first infrared sensor 10 and the second infrared sensor 11 are arranged in parallel to each other across the center of the probe 2, and the emission inlet 18a of the light guide tube 18 is positioned approximately at the center of the probe 2 and the emission outlet 18b is positioned toward the first infrared sensor 10, whereby the light guide tube 18 is positioned diagonally against the center line of the probe 2.

Furthermore, in this embodiment, the first infrared sensor 10 and the second infrared sensor 11 are sealed with cover 21 which adheres the window member with low melting-point glass to receive infrared radiation through the windows 22 and 23. The windows 22 and 23 are made from barium fluoride (BaF$_2$) or silicon (Si) with anti-reflection coating (AR coating). Nitrogen gas is sealed in the room enclosed with the cover 21 to prevent the first infrared sensor 10 and the second infrared sensor 11 from being deteriorated.

It is to be understood that the operation of the radiation clinical thermometer of this embodiment is the same as the first embodiment shown in FIG. 1 and, for this reason, an explanation is omitted here.

Figure 4A:
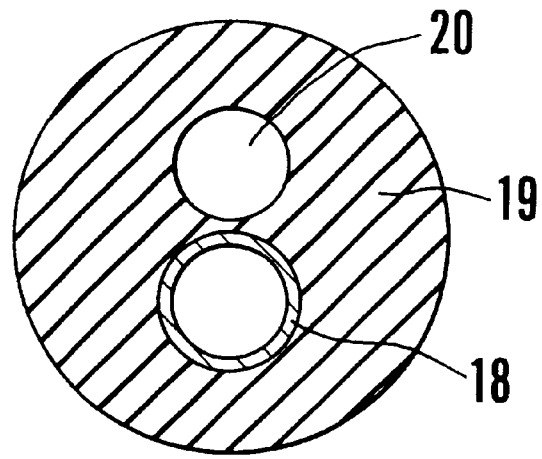
FIG. 4A is a cross-section view taken on line A–A' of FIG. 3, FIG. 4B being a cross-section view taken on line B–B' of FIG. 3, and FIG. 4C being a cross-section view taken on line C–C' of FIG. 3.
Figure 4B:
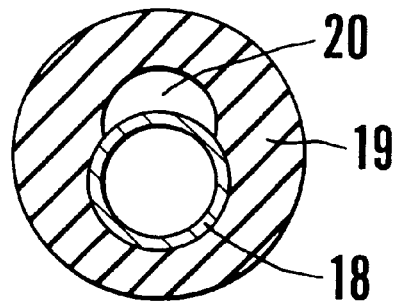
Figure 4C:
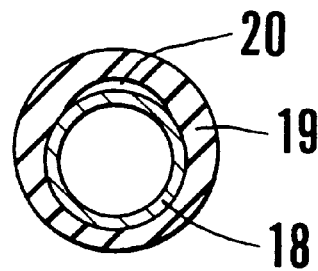

FIG. 4 are cross-sectional views of the radiation clinical thermometer shown in FIG. 3; FIG. 4A is a cross-section view taken on line A–A' of FIG. 3; FIG. 4B is a cross-section view taken on line B–B' of FIG. 3; and FIG. 4C is a cross-section view taken on line C–C' of FIG. 3. In each cross-section view, only the light guide tube 18, the supporting member 19, and the reference cavity 20 are illustrated.

It is to be clearly understood that the outer wall of the light guide tube 18 constitutes a part of the inner wall of the reference cavity 20 and the reference cavity 20 is tapered toward the filter 7 from the first infrared sensor 10.

Figure 5:
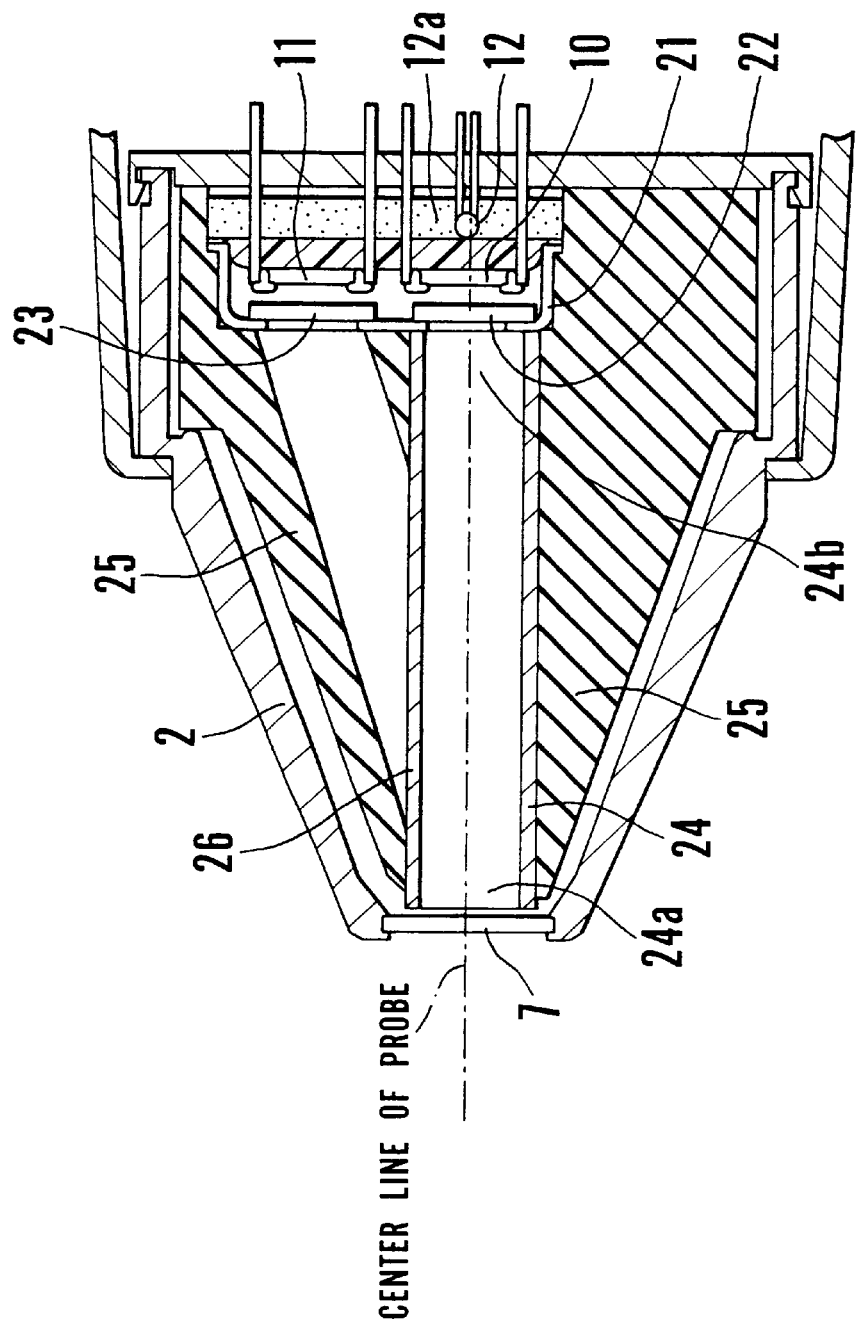
FIG. 5 is a partially cut-out cross-section view showing the probe of the third embodiment of the radiation clinical thermometer in accordance with the present invention.

FIG. 5 is a partially cut-out cross-section view showing the probe of the third embodiment of the radiation clinical thermometer in accordance with the present invention. The material of the probe 2 is, for example, ABS resin, and the probe 2 is provided inside the same with the light guide tube 24 and supporting member 25.

The light guide tube 24 is a pipe which is provided to efficiently converge the thermal radiation from the eardrum the temperature of which is to be measured, is made of metal such as copper, brass, or stainless steel, and has an inner surface which is mirror-finished and coated with gold (Au) to increase the reflectivity.

The probe 2 is provided on the top-end thereof with the filter 7 having transmission wavelength characteristics. The filter 7, a dustproof window member for transmitting infrared radiation, is formed by optical crystal such as silicon (Si) or barium fluoride (BaF$_2$), or a polymer such as polyethylene, and effectively transmits infrared-wavelength radiation.

The supporting member 25, which is a member for supporting the light guide tube 24 inside the probe 2, has the shape shown in FIG. 5 to form the reference cavity 26 which serves as the light guide tube 9 in FIG. 11. The supporting member 25 is a member of high thermal conductivity, the material of which is, for example, aluminum. The reference cavity 26 of this embodiment comprises the supporting member 25 and the outer wall of the light guide tube 24, and the reference cavity 26 is sealed at the one,end thereof (on the side of filter 7) so as to prevent infrared radiation from coming in from the temperature-measured object. Additionally the outer wall of the light guide tube 24 constitutes a part of the reference cavity 26, so that the inner wall of the reference cavity 26 has approximately the same temperature as the inner wall of the light guide tube 24. The reference cavity 26 is to reach almost the same temperature as the light guide tube 24 but is not always necessarily the same in material or inner surface condition. Furthermore the reference cavity 26 is so constructed as to be tapered toward the filter 7 side from the second infrared sensor 11 side.

This embodiment, as is understood, by comparing FIG. 3 with FIG. 5, is characterized in that the light guide tube 24 is provided perpendicular to the filter 7 and the first infrared sensor 10. That is, the first infrared sensor 10 is positioned on the center line of the probe 2 and the light guide tube 24 is positioned along the center line of the probe 2, whereby the diameter of the probe 2 is made a little larger compared with the embodiment shown in FIG. 3. However, the center axis of the supporting member 25 is the same as the center axis of the hole for inserting a pipe as the light guide tube 24, whereby the hole of the supporting member 25 can be easily and accurately finished by cutting.

Infrared sensor 10 detects the infrared radiation emitted by the temperature-measured object and converged by the light guide tube 24, and also detects the thermal radiation from the light guide tube 24 itself. The second infrared sensor 11 detects the thermal radiation from the reference cavity 26 itself because the top-end of the reference cavity 26 is sealed. In addition, the second infrared sensor 11 is provided close to the first infrared sensor 10 so as to have approximately the same temperature as the first infrared sensor 10. The temperature sensitive sensor 12 is a sensor which allows for measuring the temperature of the first infrared sensor 10 and the second infrared sensor 11. Therefore the temperature sensitive sensor 12 is preferably fixed to the bottom surface of the first infrared sensor 10 or the second infrared sensor 11, for example, by adhesive 12a. An adhesive of high thermal conductivity may be preferably selected (for example, silicone of high thermal conductivity) for the adhesive 12a.

Furthermore, in this embodiment, the first infrared sensor 10 and the second infrared sensor 11 are sealed with the cover 21 which adheres the window member with low melting-point glass to receive infrared radiation through the windows 22 and 23. The windows 22 and 23 are made from barium fluoride (BaF$_2$) or silicon (Si) with anti-reflection coating (AR coating). Nitrogen gas is sealed in the space enclosed with the cover 21 to prevent the first infrared sensor 10 and the second infrared sensor 11 from deteriorating.

It is to be understood that the operation of the radiation clinical thermometer of this embodiment is the same as the first embodiment shown in FIG. 1 and, for this reason, an explanation is omitted here.

Figure 6:
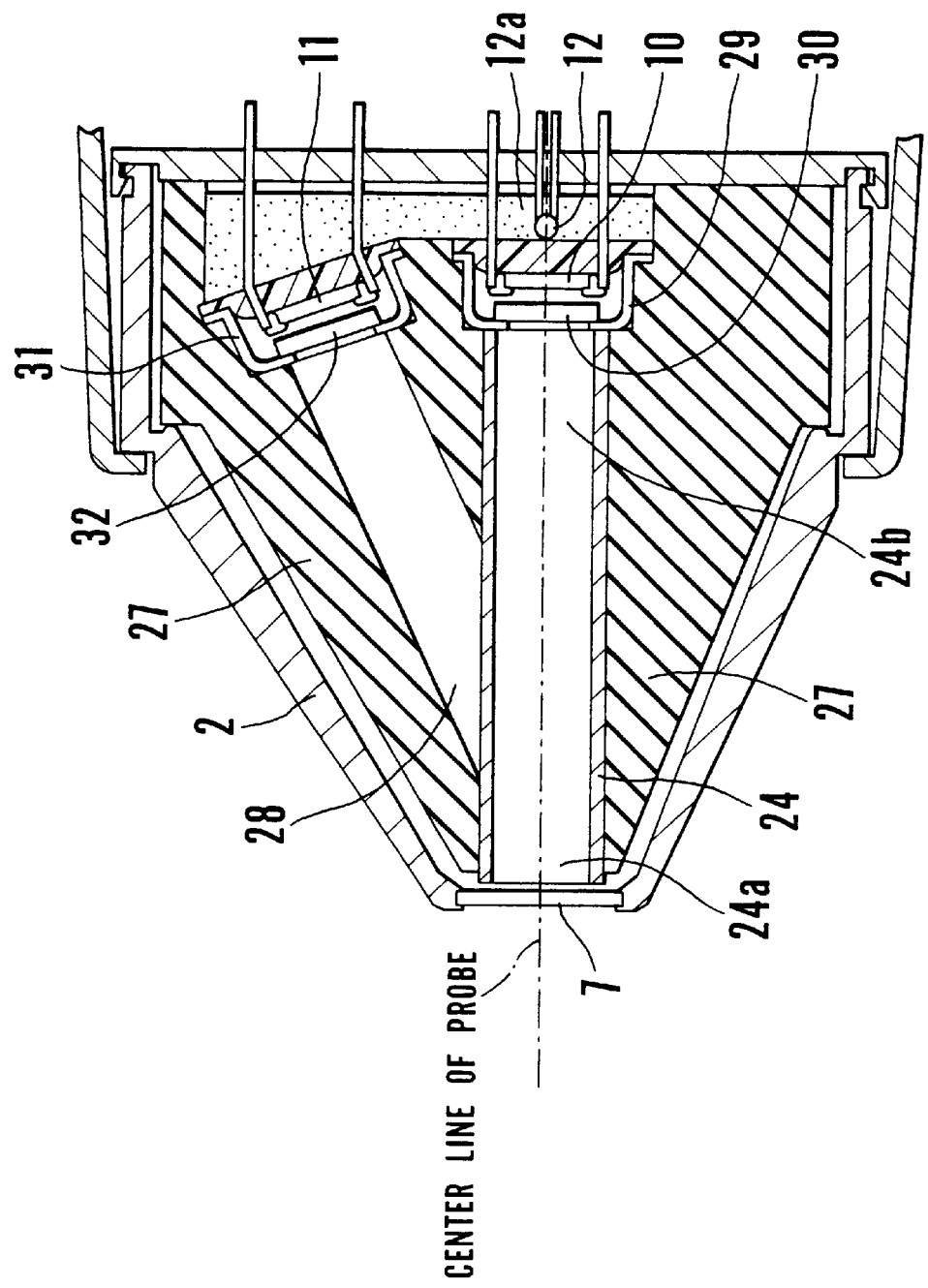
FIG. 6 is a partially cut-out cross-section view showing the probe of the fourth embodiment of the radiation clinical thermometer in accordance with the present invention.

FIG. 6 is a partially cut-out cross-section view showing the probe of the fourth embodiment of the radiation clinical thermometer in accordance with the present invention.

The material of the probe 2 is, for example, ABS resin, and the probe 2 is provided inside with the light guide tube 24 and supporting member 21.

The light guide tube 24 is a pipe to efficiently converge the thermal radiation from the eardrum the temperature of which is to be measured, is made of metal such as copper, brass, or stainless steel, and has an inner surface which is mirror-finished and coated with gold (Au) to increase the reflectivity.

The probe 2 is provided on the top-end thereof with the filter 7 having transmission wavelength characteristics. The filter 7, a dustproof window member for transmitting infrared radiation, is formed by optical crystal such as silicon (Si) or barium fluoride (BaF$_2$), or a polymer such as polyethylene, and selectively transmits infrared-wavelength radiation.

The supporting member 27, which is a member for supporting the light guide tube 24 inside the probe 2, has the shape shown in FIG. 6 to form the reference cavity 28 which serves as the light guide tube 9 in FIG. 11. The supporting member 21 is a member of high thermal conductivity, the material of which is, for example, aluminum. The reference cavity 28 of this embodiment comprises the supporting member 27 and the outer wall of the light guide tube 24, and the reference cavity 28 is sealed at the one end thereof (on the side of filter 7) so as to prevent infrared radiation from coming in from the temperature-measured object. Additionally, the outer wall of the light guide tube 24 constitutes a part of the reference cavity 28, so that the inner wall of the reference cavity 28 has approximately the same temperature as the inner wall of the light guide tube 24. The condition required for the reference cavity 28 is to reach almost the same temperature as the light guide tube 24 but is not always necessarily the same in material or inner surface condition. Furthermore the reference cavity 28 is so constructed as to be tapered toward the filter 7 from the second infrared sensor 11.

Infrared sensor 10 detects the infrared radiation emitted by the temperature-measured object and converged by the light guide tube 24, and detects the thermal radiation from the light guide tube 24 itself. The second infrared sensor 11 detects the thermal radiation from the reference cavity 28 itself because the top-end of the reference cavity 28 is sealed. In addition, the second infrared sensor 11 is provided close to the first infrared sensor 10 so as to have approximately the same temperature as the first infrared sensor 10. The temperature sensitive sensor 12 is a sensor which allows for measuring the temperature of the first infrared sensor 10 and the second infrared sensor 11. Therefore the temperature sensitive sensor 12 is preferably fixed to the bottom surface of the first infrared sensor 10 or the second infrared sensor 11, for example, by adhesive 12a. An adhesive of high thermal conductivity may be preferably selected (for example, silicone of high thermal conductivity) as the adhesive 12a.

Furthermore, in this embodiment, unlike the embodiment shown in FIG. 5, the first infrared sensor 10 and the second infrared sensor 11 are not built in one piece. That is, the first infrared sensor 10 is covered with a cover 29 having a window 30; the second infrared sensor 11 is covered with a cover 31 having a window 32; the covers 29 and 31 are sealed with silicone of high thermal conductivity; the windows 30 and 32 are made from barium fluoride (BaF$_2$) or silicon (Si) with anti-reflection coating (AR coating); and nitrogen gas is sealed in the space enclosed with the covers 29 and 31 to prevent the first infrared sensor 10 and the second infrared sensor 11 from deteriorating. As long as the first infrared sensor 10 and the second infrared sensor 11 have approximately the same temperature, the first infrared sensor 10 and the second infrared sensor 11 are not necessarily made in one piece but may be made separate, and also the angles of the first infrared sensor 10 and the second infrared sensor 11 may differ.

It is to be understood that the operation of the radiation clinical thermometer of this embodiment is the same as the first embodiment shown in FIG. 1 and, therefore, an explanation is omitted here.

Figure 7:
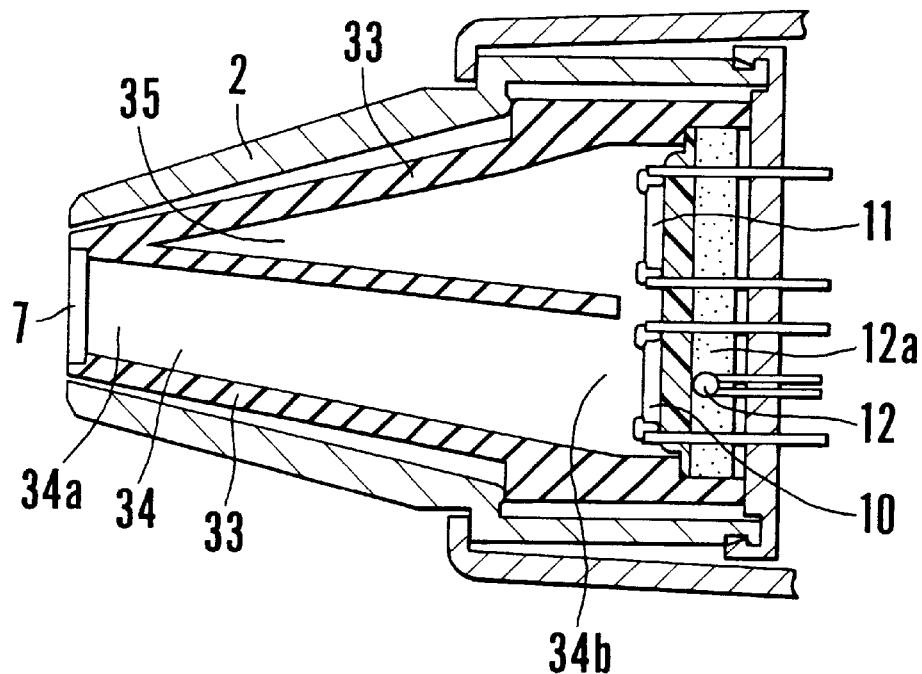
FIG. 7 is a partially cut-out cross-section view showing the probe of the fifth embodiment of the radiation clinical thermometer in accordance with the present invention.

FIG. 7 is a partially cut-out cross-section view showing the probe of the fifth embodiment of the radiation clinical thermometer in accordance with the present invention.

The material of the probe 2 is, for example, ABS resin, and the probe 2 is provided inside with the supporting member 33.

The supporting member 33 is provided on the top-end thereof with the filter 7 having transmission wavelength characteristics The filter 7, a dustproof window member for transmitting infrared radiation, is formed by optical crystal such as silicon (Si) or barium fluoride (BaF$_2$), or a polymer such as polyethylene, and selectively transmits infrared-wavelength radiation.

The supporting member 33 has the shape shown in FIG. 7 so as to form the light guide hole 34 which serves as the light guide tube 8 shown in FIG. 11 and so as to form the reference cavity 35 which serves as the light guide tube 9 shown in FIG. 11. The material of the supporting member 33 is, for example, aluminum or plastic and, in the case of plastic, one of high thermal conductivity may be preferably selected. The inner surface of the light guide hole 34 is a mirror-finished surface coated with gold (Au) to increase the reflectivity. To treat the surface with gold, nickel may be coated before gold to the original surface, or gold may be directly deposited on the plastic surface. The reference cavity 35 is sealed at the one end thereof (on the side of filter 7) so as to prevent infrared radiation from coming in from the temperature-measured object. Additionally, the reference cavity 35 is provided close to the light guide hole 34 so as to have approximately the same temperature as the light guide hole 34. The reference cavity 35 reaches approximately the same temperature as the light guide hole 34 but is not always necessarily the same in material or inner surface condition. Furthermore the reference cavity 35 is so constructed as to be tapered toward the filter 7 from the second infrared sensor 11.

Infrared sensor 10 detects the infrared radiation emitted by the temperature-measured object and converged by the light guide hole 34, and also detects the thermal radiation from the light guide hole 34 itself. The second infrared sensor 11 detects the thermal radiation from the reference cavity 35 itself because the top-end of the reference cavity 35 is sealed. In addition, the second infrared sensor 11 is provided close to the first infrared sensor 10 so as to have approximately the same temperature as the first infrared sensor 10. The temperature sensitive sensor 12 is a sensor which allows for measuring the temperature of the first infrared sensor 10 and the second infrared sensor 11. Therefore the temperature sensitive sensor 12 is preferably fixed to the bottom surface of the first infrared sensor 10 or the second infrared sensor 11, for example, by adhesive 12a. An adhesive of high thermal conductivity may be preferably selected (for example, silicone of high thermal conductivity) as the adhesive 12a.

It is to be understood that the operation of the radiation clinical thermometer of this embodiment is the same as the first embodiment shown in FIG. 1 and, therefore, an explanation is omitted here.

Figure 8:
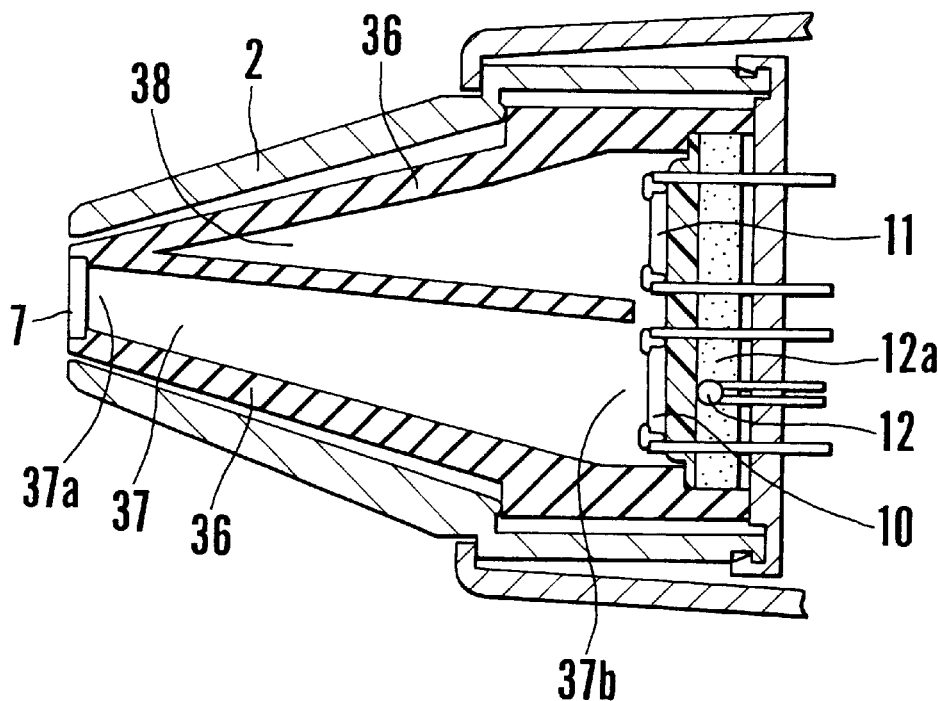
FIG. 8 is a partially cut-out cross-section view showing the probe of the sixth embodiment of the radiation clinical thermometer in accordance with the present invention.

FIG. 8 is a partially cut-out cross-section view showing the probe of the sixth embodiment of the radiation clinical thermometer in accordance with the present invention.

The material of the probe 2 is, for example, ABS resin, and the probe 2 is provided inside with the supporting member 36.

The supporting member 36 is provided on the top-end thereof with the filter 7 having transmission wavelength characteristics The filter 7, a dustproof window member for transmitting infrared radiation, is formed by optical crystal such as silicon (Si) or barium fluoride (BaF$_2$), or a polymer such as polyethylene, and selectively transmits infrared-wavelength radiation.

The supporting member 36 has the shape shown in FIG. 8 so as to form the light guide hole 37 as a light guide means which serves as the light guide tube 8 shown in FIG. 11 and so as to form the reference cavity 38 which serves as the light guide tube 9 shown in FIG. 11. The material of the supporting-member 36 is, for example, aluminum or plastic and, in the case of plastic, one of high thermal conductivity may be preferably selected. The inner surface of the light guide hole 37 is a mirror-finished surface coated with gold (Au) to increase the reflectivity. To treat the surface with gold, nickel may be coated before gold to the original surface, or gold may be directly deposited on the plastic surface. The reference cavity 38 is sealed at the one end thereof (on the side of filter 7) so as to prevent infrared radiation from coming in from the temperature-measured object. Additionally, the reference cavity 38 is provided close to the light guide hole 37 so as to have approximately the same temperature as the light guide hole 37. The reference cavity 38 reaches approximately the same temperature as the light guide hole 37 but is not always necessarily the same in material or inner surface condition. Furthermore the reference cavity 38 is so constructed as to be tapered toward the filter 7 side from the second infrared sensor 11 side.

Additionally, in this embodiment, the light guide hole 37 is so constructed as to be tapered toward the filter 7 from the first infrared sensor 10. It may be considered reasonable that a small emission inlet for the infrared radiation from the temperature-measured object causes the incident energy received by the first infrared sensor 10 to decrease, however, the incident energy is never made small according to this embodiment. This is explained below.

When the light guide hole 37 becomes smaller, the infrared radiation from the temperature-measured object reaches the infrared sensor 10 by reflecting more frequently inside the light guide hole 37, and thus the incident energy is attenuated. In this embodiment, the reflective coefficient of the light guide hole 37 is made extremely close to 1, whereby an increase in the number of reflections inside the light guide hole 37 may not cause energy attenuation due to reflection. Additionally, in the case where the inner surface of the light guide hole 37 is a perfect reflector, the incident energy to be received by the first infrared sensor depends on the size of the emission outlet of the light guide hole 37 which determines the view of the infrared sensor. Generally narrowing the view tends to result in a decrease in the incident energy. As shown in FIG. 8, the incident energy never decreases unless the emission outlet of the light guide hole 37 is made smaller, and thus sensitivity is never deteriorated.

Turning to FIG. 8, infrared sensor 10 detects the infrared radiation emitted by the temperature-measured object and converged by the light guide hole 37, and also, detects the thermal radiation from the light guide hole 37 itself. The second infrared sensor 11 detects the thermal radiation from the reference cavity 38 itself because the top-end of the reference cavity 38 is sealed. In addition, the second infrared sensor 11 is provided close to the first infrared sensor 10 so as to have approximately the same temperature as the first infrared sensor 10. The temperature sensitive sensor 12 is a sensor which allows for measuring the temperature of the first infrared sensor 10 and the second infrared sensor 11.

Therefore the temperature sensitive sensor 12 is preferably fixed to the bottom surface of the first infrared sensor 10 or the second infrared sensor 11, for example, by adhesive 12a. An adhesive of high thermal conductivity may be preferably selected (for example, silicone of high thermal conductivity) as the adhesive 12a.

It is to be understood that the operation of the radiation clinical thermometer of this embodiment is the same as the first embodiment shown in FIG. 1 and, therefore, an explanation is omitted here.

In this embodiment, when the supporting member 36 is provided with the light guide hole 37, the light guide hole 37 tapers from the first infrared sensor 10 side towards the filter 7 side. However, the present invention is not limited thereto. When a light guide tube is used, the light guide tube tapers toward the filter 7 side from the first infrared sensor 10 side. In this case, the light guide tube may be made from metal such as copper, brass, or stainless steel, and also from plastic as other material by depositing gold on to a plastic film having mirror surface and then forming a cone of the film to use the cone as the light guide tube.

Furthermore, in this embodiment, both the reference cavity 38 and the light guide hole 37 are so constructed as to be tapered toward the filter 7 side from the first infrared sensor 10 or the second infrared sensor 11, to which the present invention is not limited, however, only the light guide hole 37 may be so constructed as to be tapered toward the filter 7 from the first infrared sensor 10.

Figure 9:
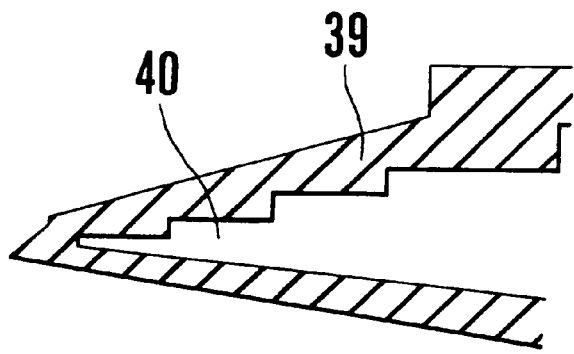
FIG. 9 is an explanatory view showing an example of the shape of the reference cavity of the radiation clinical thermometer in accordance with the present invention.

In each embodiment explained above the reference cavity of the supporting member is formed by die-casting. However the present invention is not limited thereto and the reference cavity may for example be formed by cutting. In this case the reference cavity is not always necessarily to be tapered continuously smooth but it is sufficient that the area of the emission inlet is smaller than the area of the emission outlet. For example, as shown in FIG. 9, the supporting member 39 may be tapered stepwise when the reference cavity 40 is formed. Even in this case, it still remains unchanged that the reference cavity 40 is so constructed as to be tapered off toward the emission inlet of the light guide means from the second infrared sensor side.

TECHNICAL AVAILABILITY OF THE INVENTION

The present invention is disclosed for a radiation clinical thermometer, however, it may be applied generally to a radiation thermometer.

What is claimed is:

1. A radiation clinical thermometer comprising a probe; a light guide means which is provided with an emission inlet and an emission outlet to guide the infrared radiation from the temperature-measured object; a first infrared sensor for detecting the infrared radiation from the light guide means; a temperature sensitive sensor which generates a reference temperature signal; a reference cavity which indicates approximately the same temperature condition as said light guide means and is sealed so as to shut out infrared radiation from outside; a second infrared sensor for detecting the infrared radiation from the reference cavity; a temperature computing means for calculating temperature in accordance with the signals from said first infrared sensor, said second infrared sensor, and said temperature sensitive sensor; and a display unit for displaying temperature in accordance with the signal from the temperature computing means; wherein the probe is provided on the inside thereof with said light guide means and said reference cavity, at least either said light guide means or said reference cavity being tapered off toward the emission inlet from said first or second infrared sensor side.

2. The radiation clinical thermometer set forth in claim 1 characterized in that said light guide means comprises a pipe and said reference cavity comprises a supporting member which also supports said pipe.

3. The radiation clinical thermometer set forth in claim 2 characterized in that said supporting member is made of a material with high thermal conductivity.

4. The radiation clinical thermometer set forth in claim 3 characterized in that said member of high thermal conductivity is made of aluminum.

5. The radiation clinical thermometer set forth in claim 2 characterized in that said first infrared sensor and said second infrared sensor are arranged in parallel to each other across the center of said probe, and the emission inlet of said pipe is positioned approximately at the center of said probe and the emission outlet is positioned toward said first infrared sensor, whereby the pipe is positioned diagonally against the center line of said probe.

6. The radiation clinical thermometer set forth in claim 2 characterized in that said first infrared sensor is positioned on the center line of said probe and said pipe is positioned along said center line.

7. The radiation clinical thermometer set forth in claim 2 characterized in that a window member for transmitting infrared radiation is fitted to said pipe so as to seal the emission inlet of said light guide means.

8. The radiation clinical thermometer set forth in claim 2 characterized in that a window member for transmitting infrared radiation is fitted to said supporting member so as to seal the emission inlet of said light guide means.

9. The radiation clinical thermometer set forth in claim 1 characterized in that said light guide means comprises a pipe and said reference cavity comprises the outer wall of said pipe and the supporting member which supports said pipe.

10. The radiation clinical thermometer set forth in claim 1 characterized in that said light guide means and said reference cavity are formed into the same member in one piece.

11. The radiation clinical thermometer set forth in claim 1 characterized in that said temperature sensitive sensor is adhered to the bottom surface of said first infrared sensor or second infrared sensor by an adhesive.

12. The radiation clinical thermometer set forth in claim 1 characterized in that a window member for transmitting infrared radiation is fitted to said probe so as to seal the emission inlet of said light guide means.

\* \* \* \* \*